US006553834B2

(12) United States Patent  
Blake

(10) Patent No.: US 6,553,834 B2
(45) Date of Patent: Apr. 29, 2003

(54) DOUBLE RESONATING BEAM FORCE TRANSDUCER WITH REDUCED LONGITUDINAL PUMPING

(75) Inventor: Graeme A. Blake, Bellevue, WA (US)

(73) Assignee: Honeywell International, Inc., Morristown, NJ (US)

( * ) Notice: Subject to any disclaimer, the term of this patent is extended or adjusted under 35 U.S.C. 154(b) by 83 days.

(21) Appl. No.: 09/907,729

(22) Filed: Jul. 17, 2001

(65) Prior Publication Data

US 2002/0125791 A1 Sep. 12, 2002

Related U.S. Application Data

(60) Provisional application No. 60/262,470, filed on Jan. 17, 2001.

(51) Int. Cl.[7] .............................................. G01C 19/00
(52) U.S. Cl. .................................................... 73/504.16
(58) Field of Search ........................ 73/504.16, 504.15, 73/504.12

(56) References Cited

U.S. PATENT DOCUMENTS

| 4,299,122 A | 11/1981 | Ueda et al. ............... 73/862.59 |
| 4,658,174 A | 4/1987 | Albert ........................ 310/323 |
| 4,773,493 A | * 9/1988 | Goodier .................. 177/210 FP |

FOREIGN PATENT DOCUMENTS

| EP | 0 030 741 A | 6/1981 | ............. G01L/1/10 |
| WO | WO 88 00334 A | 1/1988 | ............. G01G/3/14 |
| WO | WO 95 31859 A | 11/1995 | ............. H03H/9/21 |

OTHER PUBLICATIONS

Abstract of JP 02 262874A, Patent Abstracts of Japan, vol. 15, No. 14 (E–1022), Jan. 11, 1991.

* cited by examiner

Primary Examiner—Richard A. Moller
(74) Attorney, Agent, or Firm—Charles J. Rupnick

(57) ABSTRACT

A resonator beam structure that, during vibration of the tines, minimizes coupling of a longitudinal motion of the tines into a support structure to which the resonator beam is attached. The resonator beam includes a pair of tines; a first base region mechanically coupling a first ends of the tines together; a second base region mechanically coupling the second ends of the tines together; a first cutout of a first predetermined geometry at a first predetermined position in a closed interior portion of the first base region; and a second cutout of a second predetermined geometry at a second predetermined position in a closed interior portion of the second base region. The invention includes a method for using finite element analysis to determine an optimum geometry and position of the cutouts.

21 Claims, 6 Drawing Sheets

$$D := \begin{pmatrix} 1 & 1 & 1 \\ 1 & 1 & 0 \\ 1 & 1 & -1 \\ 1 & 0 & 1 \\ 1 & 0 & 0 \\ 1 & 0 & -1 \\ 1 & -1 & 1 \\ 1 & -1 & 0 \\ 1 & -1 & -1 \\ 0 & 1 & 1 \\ 0 & 1 & 0 \\ 0 & 1 & -1 \\ 0 & 0 & 1 \\ 0 & 0 & 0 \\ 0 & 0 & -1 \\ 0 & -1 & 1 \\ 0 & -1 & 0 \\ 0 & -1 & -1 \\ -1 & 1 & 1 \\ -1 & 1 & 0 \\ -1 & 1 & -1 \\ -1 & 0 & 1 \\ -1 & 0 & 0 \\ -1 & 0 & -1 \\ -1 & -1 & 1 \\ -1 & -1 & 0 \\ -1 & -1 & -1 \end{pmatrix}$$

Fig. 4

$$RES := 10^{-4} * \begin{pmatrix} -6.04903 \\ -6.18054 \\ -6.49559 \\ -6.16593 \\ -6.20150 \\ -6.47571 \\ -6.19634 \\ -6.19621 \\ -6.46493 \\ 4.68590 \\ 4.14590 \times 10^{-2} \\ -4.49744 \\ 4.74662 \\ 0.135877 \\ -4.20176 \\ 4.53394 \\ 6.64544 \times 10^{-2} \\ -4.19338 \\ 216.749 \\ 0.734371 \\ 9.63027 \\ 213.197 \\ 71.2335 \\ 10.24755 \\ 207.580 \\ 67.5859 \\ 9.60993 \end{pmatrix}$$

Fig. 5

$$COEFF = \begin{pmatrix} -4.794 \times 10^{-3} \\ -3.206 \times 10^{-4} \\ 3.533 \times 10^{-3} \\ 4.816 \times 10^{-4} \\ -5.058 \times 10^{-3} \\ 8.152 \times 10^{-5} \\ 3.667 \times 10^{-3} \\ -9.192 \times 10^{-4} \\ 1.669 \times 10^{-3} \end{pmatrix}$$

Fig. 6

DOUBLE RESONATING BEAM FORCE TRANSDUCER WITH REDUCED LONGITUDINAL PUMPING

This application claims the benefit of U.S. Provisional Application Ser. No. 60/262,470, filed in the name of Graeme A. Blake on Jan. 17, 2001, the complete disclosure of which is incorporated herein by reference.

FIELD OF THE INVENTION

The present invention relates generally to double resonating beam force transducers and double ended tuning fork (DETF) sensors, and in particular to double resonating beam force transducers and DETF sensors decoupled from a support structure and a method of determining a decoupled resonator beam structure.

BACKGROUND OF THE INVENTION

Typical double resonating beam force transducers and double ended tuning fork (DETF) sensors have two tines having constant widths. The tines terminate in solid base regions at each end of the beam, where the beam is tied into the support structure of the transducer. The tine terminations may be of various shapes, as described in U.S. Pat. No. 4,724,351 to Eernisse et al, which is incorporated in its entirety herein by reference. The Eernisse et al patent also describes tines of non-constant width.

A problem arises when the resonator beam is vibrated: the longitudinal motion of the ends of the tines is coupled through base regions to the support structure of the transducer. This coupling acts to reduce the Q factor of the resonator beam, and changes the resonator beam's frequency. The continual transfer of energy from the resonator to the surrounding structure due to longitudinal motion of the base regions is commonly referred to as an "end pumping" effect.

Other double resonating beam force transducers and double ended tuning fork (DETF) sensors have two constant-width tines with additional lateral teeth to aid in driving the resonator beam through electrical attraction to similar toothed structures. The additional lateral driver teeth on the tines tends to increase the end pumping effect of the coupling.

An additional problem arises in devices having multiple resonators, which is common in accelerometers and similar devices. The coupling of one resonator into the support structure can transmit energy to the other resonators in the device and change their frequency. These changes in frequency lead to errors in indicated force.

Prior art solutions, such as those disclosed in the Eernisse et al patent, for reducing the effects of coupling have been to stiffen the midsection of the tines, shape the tine cross section, or modify the root of the tine near the base region where the beam is connected to the support structure. However, forming such irregular tine shapes presents manufacturing challenges.

SUMMARY OF THE INVENTION

The present invention provides a resonator beam that overcomes the limitations of the prior art by providing a resonator beam structure that, during vibration of the tines, minimizes coupling of a longitudinal motion of the tines into a support structure to which the resonator beam is attached. The resonator beam includes a pair of tines having a first and a second end; a first base region mechanically coupling together the first ends of the tines; a second base region mechanically coupling together the second ends of the tines; a first cutout at a first predetermined position in a closed interior portion of the first base region and having a first predetermined geometry; and a second cutout at a second predetermined position in a closed interior portion of the second base region and having a second predetermined geometry.

The first and second predetermined positions are positions that are predetermined to minimize, during vibration of the tines, coupling of the longitudinal motion of the tines into a support structure to which the resonator beam is attached. The predetermined position of the first cutout is a position that is adjacent to the first end of the tines; and the predetermined position of the second cutout is a position that is adjacent to the second end of the tines.

The first and second predetermined geometries are geometries that are predetermined to minimize, during vibration of the tines, coupling of the longitudinal motion of the tines into a support structure to which the resonator beam is attached. The predetermined geometries are, for example, rectangular shapes having respective first and second predetermined sizes. The first and second predetermined geometries are, for example, substantially identical.

The invention also provides a method using finite element analysis techniques for determining optimal geometries and positions for cutouts in the enlarged or widened base regions of the resonator beam structure that, during vibration of the tines, minimizes coupling of a longitudinal motion of the tines into a support structure to which the resonator beam is attached.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4 shows a coded matrix developed during practice of the method of the invention;

FIG. 5 shows a results matrix corresponding to the coded matrix shown in FIG. 4 and found using a finite element analysis program during practice of the method of the invention;

FIG. 6 shows values for coefficients used in an equation for determining the average displacement of the tines in a vibrating resonator beam.

DETAILED DESCRIPTION OF PREFERRED EMBODIMENT

In the Figures, like numerals indicate like elements.

The present invention is a resonator beam apparatus having interior cutouts in a base region of the resonator beam for reducing longitudinal pumping effects. The cutouts are formed within the interior of the base region that couples the tines together and are completely surrounded by the material of the base region.

The present invention also provides a method of determining optimal cutout geometry and position for minimizing coupling of tine longitudinal motion into a support structure. The interior cutouts are thus of a predetermined size and are formed at a predetermined position in the base region of the beam near the termination of the tines.

Figure 1:
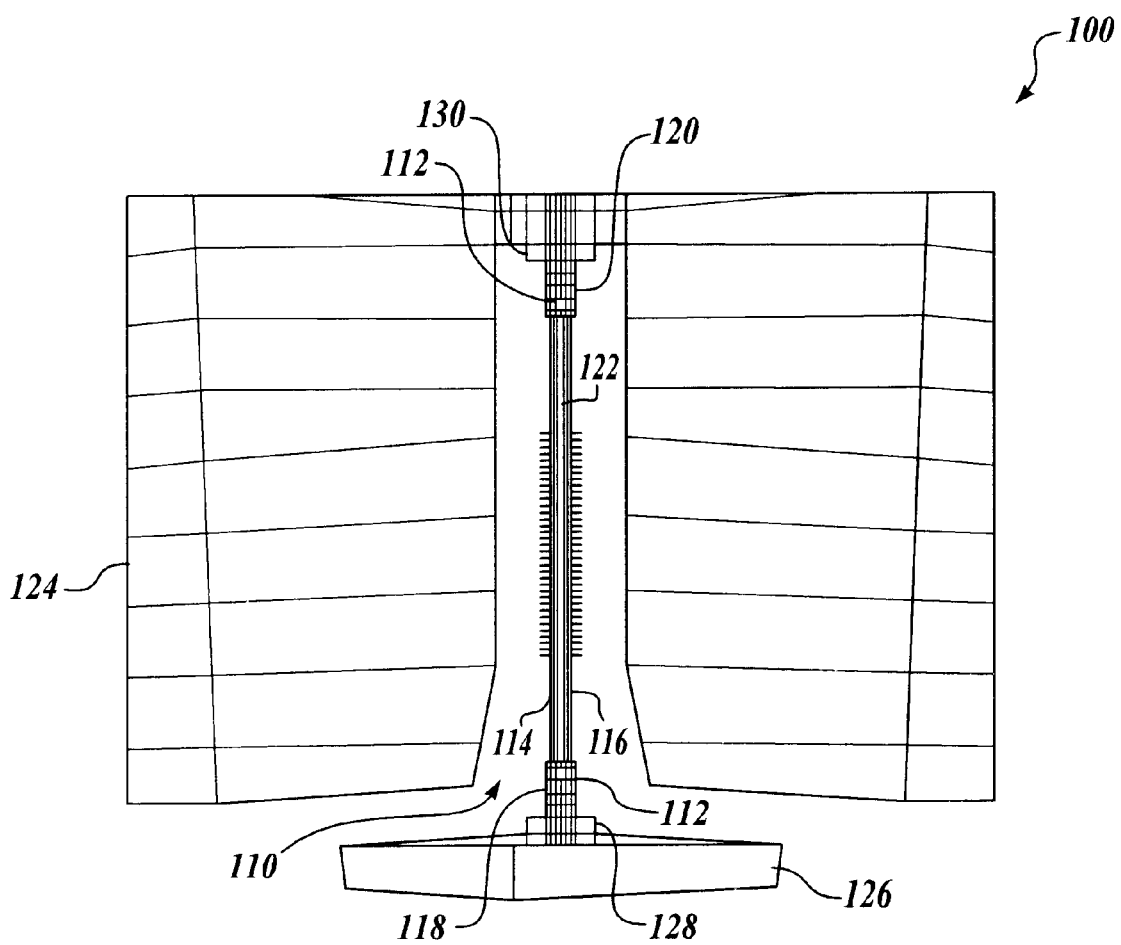
FIG. 1 shows the invention embodied as a transducer having a DETF resonator beam with cutouts of a predetermined size formed at a predetermined position.

FIG. 1 shows the invention embodied as a transducer 100 having a DETF resonator beam 110 with cutouts 112 of a predetermined size formed at a predetermined position. The DETF resonator beam 110 has a pair of generally parallel tines 114, 116 having substantially constant widths. The two tines 114, 116 are coupled together at enlarged or widened base regions 118, 120 and are separated from each other by a slot 122 to form a double ended tuning fork. The resonator beam 110 is separated from a frame portion 124 of the transducer 100 so that the tines 114, 116 may be vibrated laterally relative to fixed base regions 118, 120, as is generally known in the art and described in the Eernisse et al patent. In an accelerometer device, the base regions 118, 120 are suitably bonded to a pendulous proof mass 126 and the frame 124, respectively, by mounting pads 128, 130. The widened base regions 118, 120 mechanically couple the vibrating tines 114, 116 to each other.

As shown in FIG. 1, the resonator beam 110 may include lateral teeth as part of an electrostatic drive for laterally vibrating the tines 114, 116 at the resonance frequency. The electrostatic drive includes a pair of elongate drive electrodes (not shown) spaced away on either side of the tines 114, 116. However, the invention is equally applicable to resonator beams that are not vibrated by an electrostatic drive and do not include the lateral teeth shown in FIG. 1.

In contrast to the solutions of the prior art, the cutouts 112 of the present invention are internal cutouts formed in the base regions 118, 120 between the tines 114, 116. In other words, the cutouts 112 are completely surrounded by material forming the respective the base regions 118, 120. The size or geometry and the position within the base regions 118, 120 of the cutouts 112 are determined according to the method of the invention to minimize or eliminate coupling of the longitudinal motion of the ends of the tines 114, 116 to the support structure of the transducer when the resonator beam 110 is vibrated, which minimizes or eliminates the end pumping effect.

The method of the invention is practiced by modeling resonator beam structures having rectangular cutouts 112. Although the invention is believed to be equally applicable to alternatively shaped cutouts, rectangular cutouts 112 have been used in the practice of the invention for ease of model construction. The invention is also practiced with cutouts 112 that are substantially identical in size and shape. Optimization can be accomplished using a FEA (finite element analysis) program, such as any of the known programs, by varying the size and position parameters of the cutouts 112 while monitoring longitudinal end pumping.

Optimization is accomplished by determining the geometry and position of cutouts that provide sufficient coupling between the two tines 114, 116 such that the in-plane, out-of-phase vibration of the tines remains a normal mode, while the coupling of the vibration to the "outside world," as evidenced by end pumping effects, is reduced to a minimum.

Figure 2:
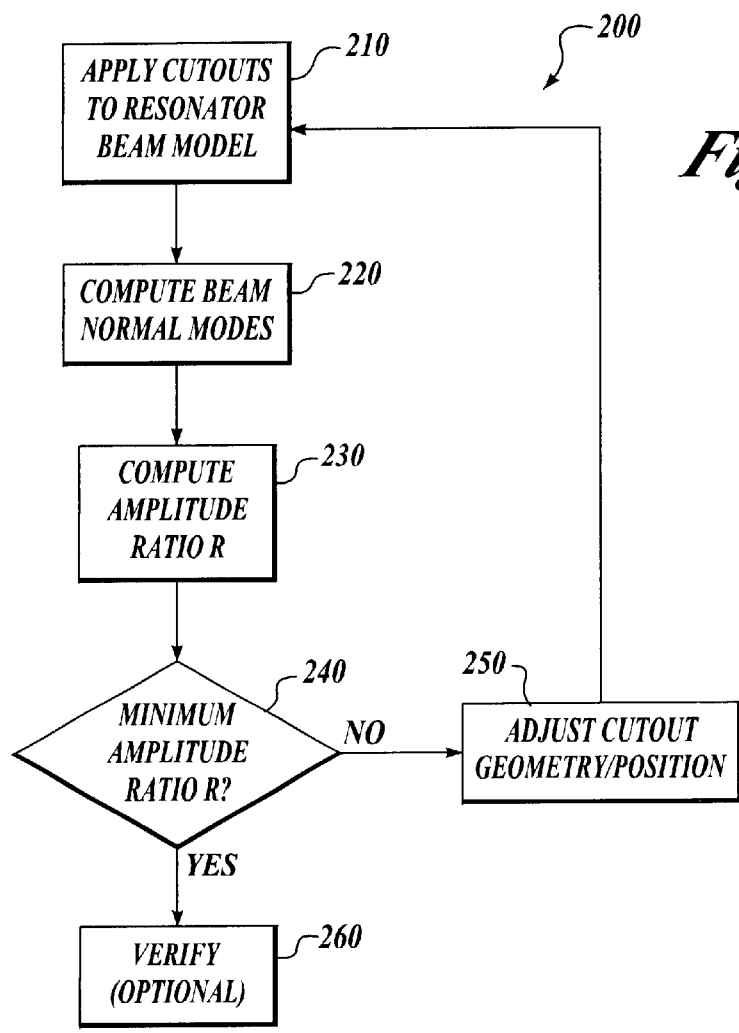
FIG. 2 is a flow chart showing the method of the invention as embodied in determining optimal cutout geometry and position that minimizes coupling of tine longitudinal motion into a support structure of a resonator beam by modeling.

FIG. 2 is a flow chart showing the method 200 of the invention as embodied in determining optimal cutout geometry and position that minimizes coupling of longitudinal motion of the tines 114, 116 into a support structure for an exemplary resonator beam 110 by modeling. The method 200 of the invention is equally applicable to other resonator beam structures, including resonator beams having tines of various shapes.

According to the method of the invention as embodied in a FEA program such as ANSYS, in a model of the resonator beam 110 having one of the base regions 118, 120 fixed, cutouts 112 of a predetermined size or geometry are applied at a predetermined position in the base regions 118, 120 at which the tines 114, 116 terminate, as shown in Block 210. The cutouts 112 in the respective base regions 118, 120 may be the same size and configuration. The normal modes of the resonator beam 110 are computed in Block 220. A ratio R is computed in Block 230 of the amplitude of the longitudinal motion of the free one of base region 118, 120 to the amplitude of the center of the tines 114, 116 in the mode used for force sensing (in-plane, out-of-phase tine motion). The amplitude ratio R computed in Block 230 is a measure of the relative effectiveness of the cutouts 112 in reducing end pumping effects. Small values for the ratio R indicate increasing effectiveness.

The amplitude ratio R is computed using the finite element analysis model to compute an amplitude of a longitudinal motion of the free one of base region 118, 120; using the finite element analysis model to compute an amplitude of the center of the tines 114, 116; and computing the ratio R of the two amplitudes. The ratio R is thus the ratio of the end motion over the tine motion.

In Block 240 the amplitude ratio R is compared with a desired minimum value indicative of an optimal cutout 112 geometry and position for the application of interest. For example, the amplitude ratio R is compared to zero. If the value of the amplitude ratio R is sufficiently close to zero, the predetermined sizes and positions of the cutouts 112 are acceptable.

If the value of the amplitude ratio R is too large to satisfy the requirements of the application, the method can be practiced iteratively. In Block 250 one or both of the size and position of the cutouts 112 are adjusted. The new size and position values for the cutouts 112 are applied to the model in Block 210, and the normal modes of the resultant resonator beam are recomputed in Block 220. The amplitude ratio R is recomputed in Block 230, and the value of the recomputed amplitude ratio R is analyzed in Block 240. The method is thus practiced iteratively until optimal size and position values for the cutouts 112 are determined, as indicated by an acceptable value of the amplitude ratio R.

The reduced end pumping effects are optionally verified in a full model of the accelerometer sensor die in which the resonator beam 110 is utilized, as shown in Block 260.

According to one exemplary implementation of the method of the invention, size or geometry and position parameters are determined for the cutouts 112 in the in the base regions 118, 120 of a resonator beam 110 of a DETF near the termination of the tines 114, 116. The cutouts 112 are rectangular. In determining the size or geometry and position parameters, three factors are considered: the distance between the ends of the tines 114, 116 and the near end of the cutout 112, the distance between the ends of the tines 114, 116 and the far end of the cutout 112, and the width of the cutout 112.

The base resonator beam 110 is substantially fixed to dimensions near those actually used for one proprietary DETF application, wherein:

Tine length: 1395 micron;

Tine width: 26 micron;

Space between tines: 26 micron;

Eernisse's L/M ratio: 1.25;

Base extension for mounting: 50 micron;

Number of teeth: 33;

Pitch of teeth: 22 micron;

Width of teeth: 5 micron;

Length of teeth: 28 micron; and

DETF thickness: 18.5 micron.

The distances from the horizontal edges of the cutouts 112 to the ends of the tines 114, 116 are expressed as equivalent L/M ratios according to the Eernisse definition, LM1 and LM2, where M is the length of the tines 114, 116 between the base regions 118, 120; and L is the length of the tines 114, 116 plus the length of the base regions 118, 120 between the mounting pads 128, 130.

The distance from the DETF center to the closest edge is LM1*Lt/2, where Lt is the length of the tines 114, 116. The distance from the center of the DETF 100 to the edge of the furthest cutout 112 is LM2*Lt/2. The width of the cutout 112 is expressed as a fraction, HRatio, of the total width of the base region 118, 120, such that the actual width of the cutout 112 is equal to HRatio*WBase, where WBase is the width of the base region 118, 120.

The FEA model is constructed and analyzed in ANSYS or another FEA program. In the FEA model, the base region 118 at one end of the DETF 100 is fixed. The base region 120 at the other end is minimally constrained to slide. The average displacement of the end of the minimally constrained mounting base region 120 in the axial direction is computed for the in-plane, out-of-phase mode, and normalized by dividing it by the in-plane displacement of a tine node at the center of the inside edge. The normalized value is used as a measure of the end pumping effect.

Figure 3:
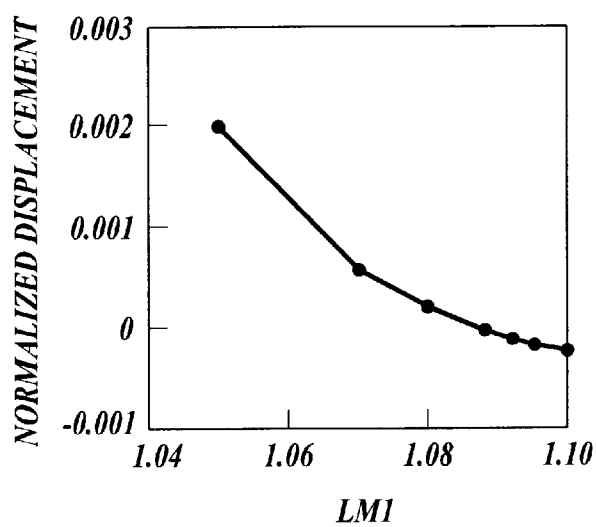
FIG. 3 is a graph showing data developed during practice of the method of the invention.

FIG. 3 is a graph showing data for a case in which the values of HRatio and LM2 are both fixed, and the material is isotropic. For the case graphed in FIG. 3, HRatio=0.5, i.e., the cutout 112 is half the width of the base region 118, 120, and LM2=1.2, i.e., the far edge of the cutout 112 corresponds to L/M=1.2.

The normalized displacements, NUY, versus LM1 values, are given by:

$$R = \begin{pmatrix} 1.05 & 1.07 & 1.08 & 1.088 & 1.092 & 1.095 & 1.1 \\ 2.033*10^{-3} & 5.923*10^{-4} & 2.103*10^{-4} & -3.076*10^{-6} & -1.038*10^{-4} & -1.558*10^{-4} & -2.417*10^{-4} \end{pmatrix}^T$$

where the first row of the matrix is filled by the LM1 values and the second row is filled by the NUY values. The graph in FIG. 3 shows a zero crossing near LM1=1.088. The curve of the data suggests that the dependence of NUY on LM1 is best modeled as a quadratic. The other factors, LM2 and HRatio, may also be best modeled as quadratic. A full quadratic DOE (design of experiments) model requires 27 runs. A DOE model, however, is less accurate than estimating the NUY values directly. A DOE model is useful for determining starting values for LM1, LM2, and HRatio to use in the direct FEA analysis. Thus, while a DOE approach is useful, one or more final FEAs are needed to find the best NUY values.

According to the present embodiment of the invention, the limits on the variables are: $0.25 \leq HRatio \leq 0.75$; $1.025 \leq LM1 \leq 1.15$; and $1.175 \leq LM2 \leq 1.225$.

The value table can be expressed as:

$$Vars = \begin{pmatrix} 1.025 & 1.0875 & 1.15 \\ 1.175 & 1.2 & 1.225 \\ 0.25 & 0.5 & 0.75 \end{pmatrix} \begin{pmatrix} -1 & 0 & 1 \\ -1 & 0 & 1 \\ -1 & 0 & 1 \end{pmatrix} \begin{matrix} LM1 \\ LM2 \\ HRatio \end{matrix}$$

The coded matrix design D is shown in FIG. 4.

The corresponding results matrix RES found using the FEA program is shown in FIG. 5.

The model is conveniently analyzed using the MATHCAD© analysis program or another analysis program. The model is analyzed in terms of three coded factors: A (LM1), B (LM2), and C (HRatio). Coded values are created corresponding to the results. These values are used as X values for a regression fit.

All the terms determined by solving for the model coefficients contribute significantly to the value of the average displacement of the ends of the tines 114, 116, i.e., end pumping effect. The formula for this displacement, NUY, can be written as:

$$NUY(A, B, C) := Coeff_0*A + Coeff_1*B + Coeff_2*C + Coeff_3*A*B \ldots + Coeff_4*A*C + Coeff_5*B*C + Coeff_6*A \ldots + Coeff_7*B^2 + Coeff_8*C^2$$

where: $Coeff_0$ through $Coeff_8$ have values shown in FIG. 6.

Figure 7A:
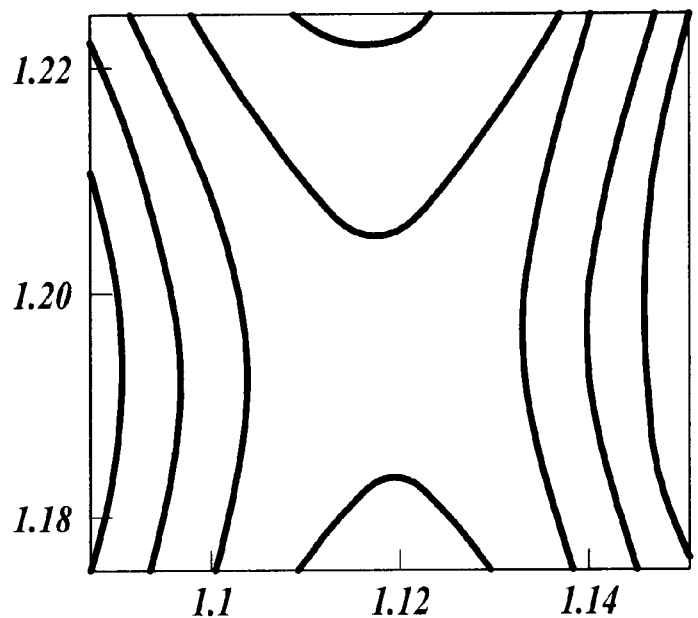
FIGS. 7A–7E are graphs showing data developed during practice of the method of the invention.
Figure 7B:
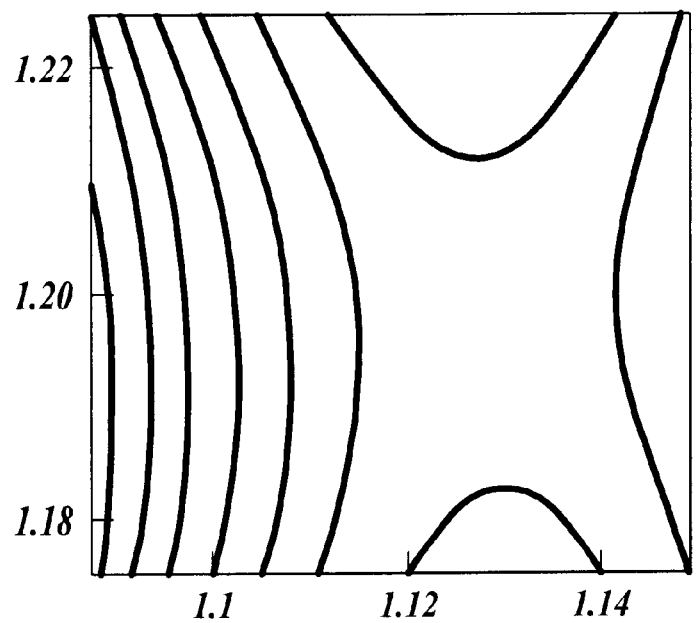
Figure 7C:
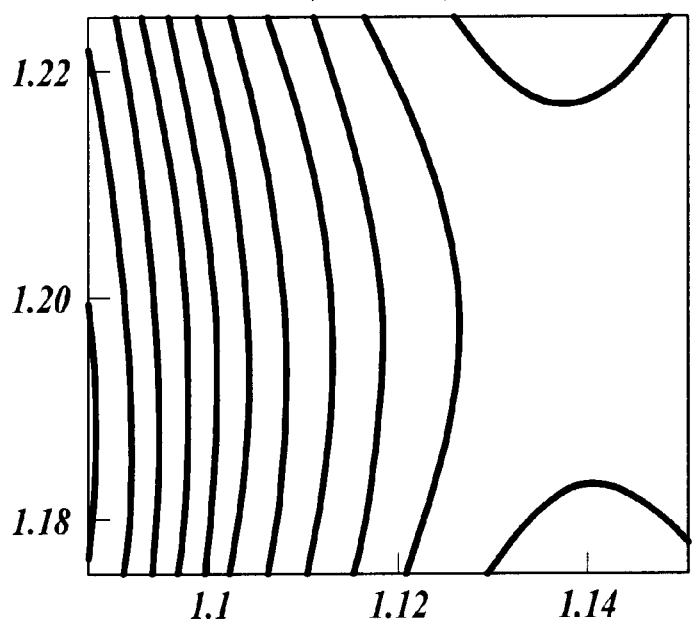
Figure 7D:
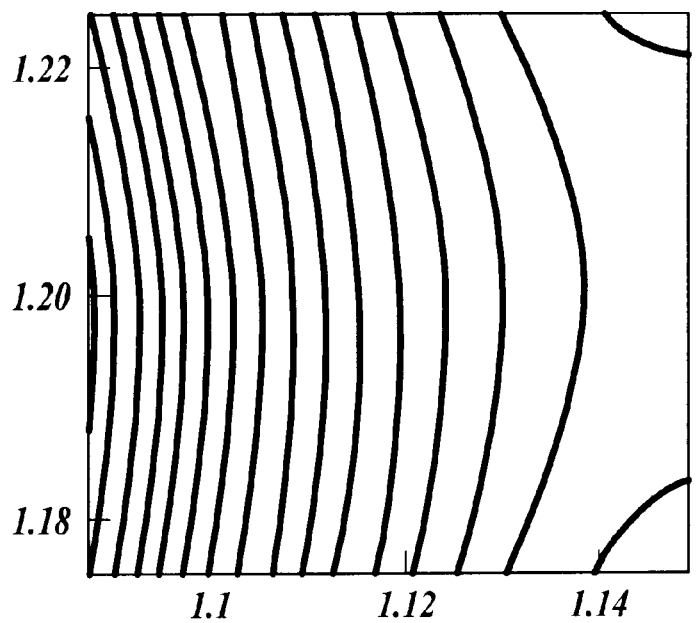

The values of NUY are plotted in FIGS. 7A–7E for various fixed C values (HRatio values), varying A (LM1) and B (LM2), in order to determine combinations of values that result in a minimum or zero value for NUY. For example, using a moderately fine grid having m:=0 ... 20 and n:=0 ... 20, for all cases $A_m := -1 + m/10$ and $B_n := -1 + n/10$, plots are generated for five C values: $-1, -0.5, 0, +0.5,$ and $+1.0$. That is: Cm1:=−1.0, Cmp5:=−0.5, C0:=0, Cpp5:=+0.5, and Cp1:=+1.0. The five plot matrices are:

FIG. 7A is a plot of $NUYm1_{m,n} := NUY(A_m, B_n, Cm1)$,

FIG. 7B is a plot of $NUYmp5_{m,n} := NUY(A_n, B_n, CMP5)$,

FIG. 7C is a plot of $NUY0_{m,n} := NUY(A_m, B_n, C0)$,

FIG. 7D is a plot of $NUYpp5_{m,n} := NUY(A_m, B_n, Cpp5)$, and

Figure 7E:
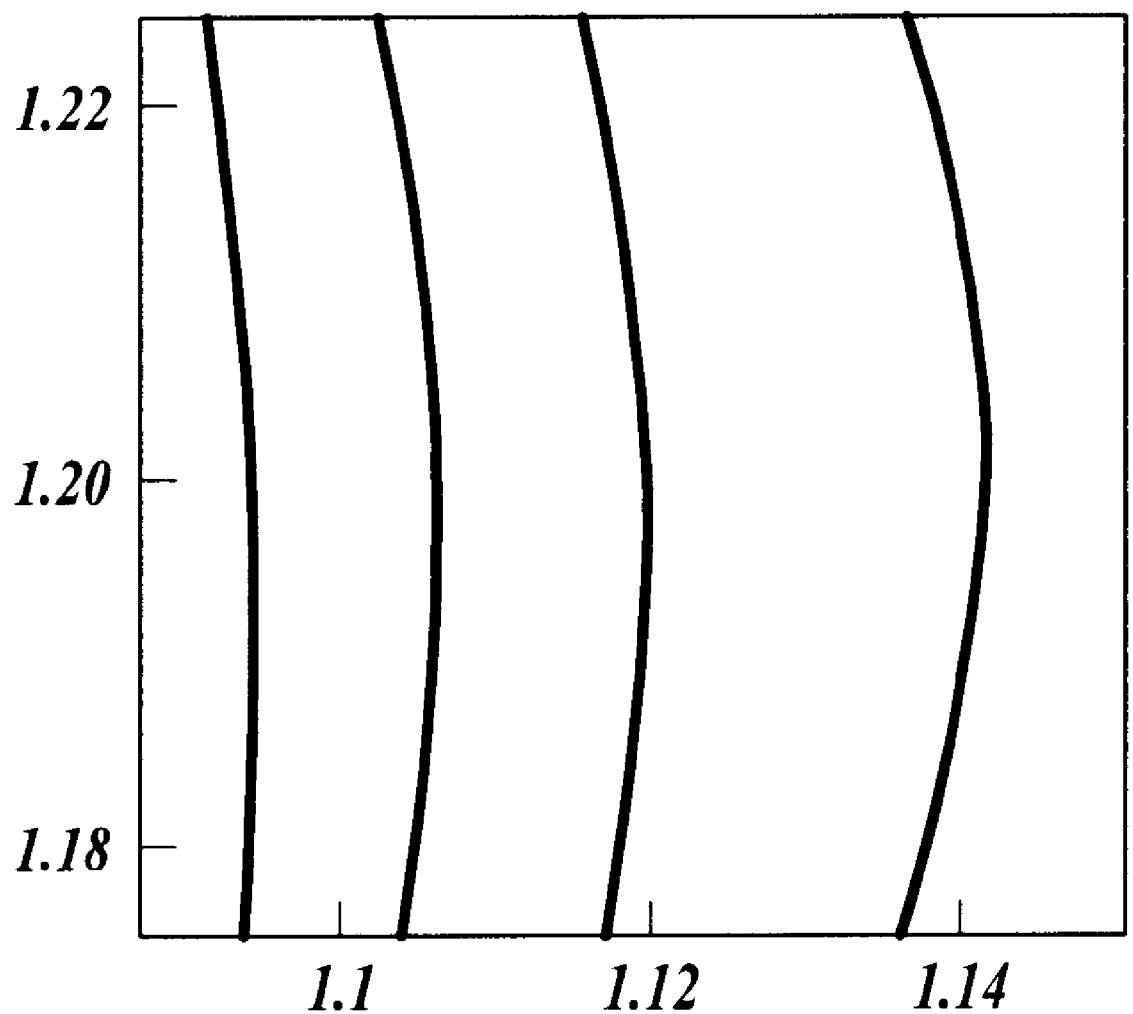

FIG. 7E is a plot of $NUYp1_{m,n} := NUY(A_m, B_n, Cp1)$.

Inspection of the plotted values shows at least one line of feasible points in each plot. A few points are selected for checking. For example, in the plot shown in FIG. 7A having HRatio=0.25, the point LM1=1.041 and LM2=1.2 is selected. In the plot shown in FIG. 7C having HRatio=0.5, the point LM1=1.087 and LM2=1.2 is selected. In the fifth plot shown in FIG. 7E having HRatio=0.75, the point LM1=1.133 and LM2=1.2 is selected. These points are expected to have NUY values near zero. In fact, the values predicted by the formula are given by:

$$Predicted := \begin{pmatrix} NUY\left(-1 + \frac{1.041 - 1.025}{0.125} * 2, 0, -1\right) \\ NUY\left(-1 + \frac{1.087 - 1.025}{0.125} * 2, 0, 0\right) \\ NUY\left(-1 + \frac{1.133 - 1.025}{0.125} * 2, 0, 1\right) \end{pmatrix}$$

$$Predicted := \begin{pmatrix} -3.015 * 10^{-5} \\ -3.859 * 10^{-5} \\ -2.715 * 10^{-5} \end{pmatrix}$$

The selection of LM1, LM2, and HRatio values from plots is limited in accuracy; the desire is that all predicted values are zero. The FEA values generated by ANSYS for the selected LM1, LM2, and HRatio values are given by:

$$FEA := \begin{pmatrix} 4.67 * 10^{-4} \\ 1.891 * 10^{-5} \\ 4.937 * 10^{-4} \end{pmatrix}$$

The FEA and Predicted values are compared for differences and ratios.
The comparisons yield:

$$FEA - \overrightarrow{Predicted} := \begin{pmatrix} 4.971 * 10^{-4} \\ -1.968 * 10^{-5} \\ 5.209 * 10^{-4} \end{pmatrix} \text{ and } \frac{\overrightarrow{FEA}}{Predicted} = \begin{pmatrix} -15.491 \\ 0.49 \\ -18.183 \end{pmatrix}$$

In determining the effectiveness of the cutouts 112, the reduction in the NUY value is compared before and after the cutouts 112 are added. In the present example, the NUY value of the DETF before addition of the cutouts 112 is NUY=$-6.834 \cdot 10^{-4}$. The magnitude of the reduction in NUY when the cutouts 112 are added is compared with the magnitude of the error. The calculation yields:

$$\left| \frac{FEA - \overrightarrow{Predicted}}{-6.834 * 10^{-4} - FEA} \right| = \begin{pmatrix} 0.432 \\ 0.028 \\ 0.442 \end{pmatrix}$$

Small values indicate increasing effectiveness. Accordingly, the case having HRatio=0.5 (0.028 element) is expected to be effective, which the other cases are not.

The second calculation compares the predicted reduction ratios to those obtained with the cutout 112. Values near 1 indicate that the obtained reduction ratios are near the predicted reduction ratios. The obtained reduction ratio is given by:

$$Obtained\ ratio := \left| \frac{-6.8\overrightarrow{34} * 10^{-4}}{FEA} \right| \text{ and}$$

$$Obtained\ ratio := \begin{pmatrix} -1.463 \\ -36.14 \\ -1.384 \end{pmatrix}$$

$$Predicted\ ratio := \left| \frac{-6.8\overrightarrow{34} * 10^{-4}}{Predicted} \right| \text{ and}$$

$$Predicted\ ratio := \begin{pmatrix} 22.67 \\ -17.709 \\ 25.169 \end{pmatrix}$$

The ratio of the ratios is given by:

$$\frac{\overrightarrow{Predicted.ratio}}{Obtained.ratio} = \begin{pmatrix} -15.491 \\ 0.49 \\ -18.183 \end{pmatrix}$$

The ratio of the predicted ratio to the obtained ratio is equal to:

$$\frac{\overrightarrow{FEA}}{Predicted}.$$

The middle value is near zero and is therefore predictive of the cutout being effective in reducing or eliminating the end pumping effect.

While the preferred embodiment of the invention has been illustrated and described, it will be appreciated that various changes can be made therein without departing from the spirit and scope of the invention.

The embodiments of the invention in which an exclusive property of privilege is claimed are defined as follows:

1. A resonator beam, comprising:
    a pair of tines having a first and a second end;
    a first base region mechanically coupling together the first ends of the tines;
    a second base region mechanically coupling together the second ends of the tines;
    a first cutout at a first predetermined position in a closed interior portion of the first base region and having a first predetermined geometry; and
    a second cutout at a second predetermined position in a closed interior portion of the second base region and having a second predetermined geometry.

2. The resonator of claim 1, wherein the first and second predetermined positions are positions that are predetermined to minimize, during vibration of the tines, coupling of a longitudinal motion of the tines into a support structure to which the resonator beam is attached.

3. The resonator of claim 2, wherein the first and second predetermined geometries are geometries that are predetermined to minimize, during vibration of the tines, coupling of the longitudinal motion of the tines into a support structure to which the resonator beam is attached.

4. The resonator of claim 3, wherein:
    the first predetermined position of the first cutout is a position that is adjacent to the first end of the tines; and
    the second predetermined position of the second cutout is a position that is adjacent to the second end of the tines.

5. The resonator of claim 1, wherein the first and second predetermined positions and the first and second predetermined geometries are predetermined using finite element analysis.

6. The resonator of claim 1, wherein the first and second predetermined geometries are rectangular shapes having respective first and second predetermined sizes.

7. The resonator of claim 1, wherein the first and second predetermined geometries are substantially identical.

8. A resonator beam, comprising:
    two elongated tines having substantially constant widths, the beams spaced apart and terminated at first and second ends in respective first and second integral base regions;
    first and second cutouts positioned in the respective first and second base regions between and adjacent to the respective first and second ends of the tines, the cutouts completely surrounded by material forming the respective first and second base regions.

9. The resonator beam of claim 8, wherein the first and second cutouts in the respective first and second base regions are positioned at positions predetermined using a finite element analysis program to minimize coupling of a vibration of the tines into a support structure to which the resonator beam is attached.

10. The resonator beam of claim 8, wherein each of the first and second cutouts is rectangular in shape.

11. The resonator beam of claim 8, wherein the first and second cutouts are substantially identical in size and shape.

12. In a resonator beam having two tines terminating in base regions, a method for minimizing coupling of vibration of the resonator beam into a support structure to which the resonator beam is attached, the method comprising:
   in a model of the resonator beam having one of the base regions fixed and an other of the base regions free, applying a cutout of a predetermined geometry at a predetermined position in an interior portion of each of the base regions;
   computing normal resonance modes of the resonator beam;
   computing a ratio of an amplitude of a longitudinal motion of the free base region to an amplitude of the center of the tines; and
   comparing the ratio with a desired minimum value.

13. The method of claim 12, wherein the comparing the ratio with a desired minimum value indicates an acceptable result, further comprising verifying the result.

14. The method of claim 13, wherein verifying the results includes testing a model of an accelerometer die in which the resonator beam is utilized.

15. The method of claim 12, wherein computing a ratio of an amplitude of a longitudinal motion of the free base region to an amplitude of the center of the tines comprises:
   computing an amplitude of a longitudinal motion of the free base region; and
   computing an amplitude of the center of the tines.

16. The method of claim 15, wherein both of the amplitude of a longitudinal motion of the free base region and the amplitude of the center of the tines are computed in a mode used for force sensing.

17. The method of claim 12, further comprising:
   determining different cutouts having one of a different geometry and a different position;
   applying the different cutouts to the model of the resonator beam; and
   computing normal resonance modes of the resonator beam having the different cutouts;
   in the model of the resonator beam having the different cutouts, computing a ratio of an amplitude of a longitudinal motion of the free base region to an amplitude of the center of the tines; and
   comparing the ratio with the desired minimum value.

18. The method of claim 17, repeating the determining, applying, computing, and comparing until the comparing the ratio with a desired minimum value indicates an acceptable result.

19. In a resonator beam having two tines terminating in base regions, a method for minimizing coupling of vibration of the resonator beam into a support structure to which the resonator beam is attached, the method comprising:
   in a finite element analysis model of the resonator beam having one of the base regions fixed and an other of the base regions free, applying a first cutout of a predetermined size at a predetermined position in an interior portion of a first one of the base regions, and applying a second cutout of a predetermined size at a predetermined position in an interior portion of a second one of the base regions;
   using the finite element analysis model, computing normal resonance modes of the resonator beam;
   using the finite element analysis model, computing an amplitude of a longitudinal motion of the free base region;
   using the finite element analysis model, computing an amplitude of the center of the tines;
   computing a ratio of an amplitude of a longitudinal motion of the free base region to an amplitude of the center of the tines in the mode used for force sensing; and
   comparing the ratio to zero.

20. The method of claim 19, further comprising:
   changing one of the predetermined size and the predetermined position of at least one of the cutouts; and
   repeating the steps of the method.

21. The method of claim 20, further comprising: repeating the steps of the method until the ratio approaches zero.

* * * * *